US010424365B2

(12) United States Patent
Raad et al.

(10) Patent No.: US 10,424,365 B2
(45) Date of Patent: Sep. 24, 2019

(54) METHODS FOR INDEPENDENT MEMORY BANK MAINTENANCE AND MEMORY DEVICES AND SYSTEMS EMPLOYING THE SAME

(71) Applicant: Micron Technology, Inc., Boise, ID (US)

(72) Inventors: George B. Raad, Boise, ID (US); Jonathan S. Parry, Boise, ID (US); James S. Rehmeyer, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/375,073

(22) Filed: Apr. 4, 2019

(65) Prior Publication Data

US 2019/0228816 A1 Jul. 25, 2019

Related U.S. Application Data

(62) Division of application No. 15/870,657, filed on Jan. 12, 2018, now Pat. No. 10,297,307.

(60) Provisional application No. 62/612,004, filed on Dec. 29, 2017.

(51) Int. Cl.
G11C 7/00 (2006.01)
G11C 11/406 (2006.01)

(52) U.S. Cl.
CPC .............. G11C 11/40618 (2013.01)

(58) Field of Classification Search
CPC ................................. G11C 11/40618
USPC ........................................ 365/222
See application file for complete search history.

(56) References Cited

U.S. PATENT DOCUMENTS

| 9,437,276 | B2 | 9/2016 | Ware et al. |
| 9,933,960 | B2 | 4/2018 | Ware et al. |
| 10,115,448 | B2* | 10/2018 | Lee .................. G11C 11/40615 |
| 2008/0056051 | A1 | 3/2008 | Mayer et al. |
| 2013/0100755 | A1 | 4/2013 | Youn et al. |
| 2014/0233325 | A1 | 8/2014 | Kim et al. |
| 2015/0055420 | A1 | 2/2015 | Bell et al. |
| 2016/0180917 | A1 | 6/2016 | Chishti et al. |
| 2016/0203853 | A1 | 7/2016 | Park et al. |
| 2016/0231963 | A1 | 8/2016 | Ware et al. |

(Continued)

OTHER PUBLICATIONS

International Application No. PCT/US2018/060233—International Search Report and Written Opinion, dated Mar. 11, 2019, 13 pages.

Primary Examiner — Harry W Byrne
(74) Attorney, Agent, or Firm — Perkins Coie LLP

(57) ABSTRACT

Memory devices, systems including memory devices, and methods of operating memory devices in which multiple counters are provided to permit memory refresh commands greater freedom in targeting subsets of the memory device for data refresh operations. In one embodiment, a memory device is provided, comprising a plurality of memory banks, and circuitry configured to (i) store a plurality of values, each of the plurality of values corresponding to one of the plurality of memory banks; (ii) refresh first data stored in a first one of the plurality of memory banks; and (iii) update a first one of the plurality of values corresponding to the first one of the plurality of memory banks based at least in part on refreshing the first data.

20 Claims, 7 Drawing Sheets

(56) References Cited

U.S. PATENT DOCUMENTS

2017/0110177 A1* 4/2017 Lee .................. G11C 11/40615

* cited by examiner

METHODS FOR INDEPENDENT MEMORY BANK MAINTENANCE AND MEMORY DEVICES AND SYSTEMS EMPLOYING THE SAME

CROSS-REFERENCE TO RELATED APPLICATIONS

This application is a division of U.S. application Ser. No. 15/870,657, filed Jan. 12, 2018; which claims the benefit of U.S. Provisional Application No. 62/612,004, filed Dec. 29, 2017; each of which is incorporated herein by reference in its entirety.

TECHNICAL FIELD

The present disclosure generally relates to semiconductor memory devices, and more particularly relates to methods for independent memory bank maintenance and memory devices and systems employing the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Figure 1:
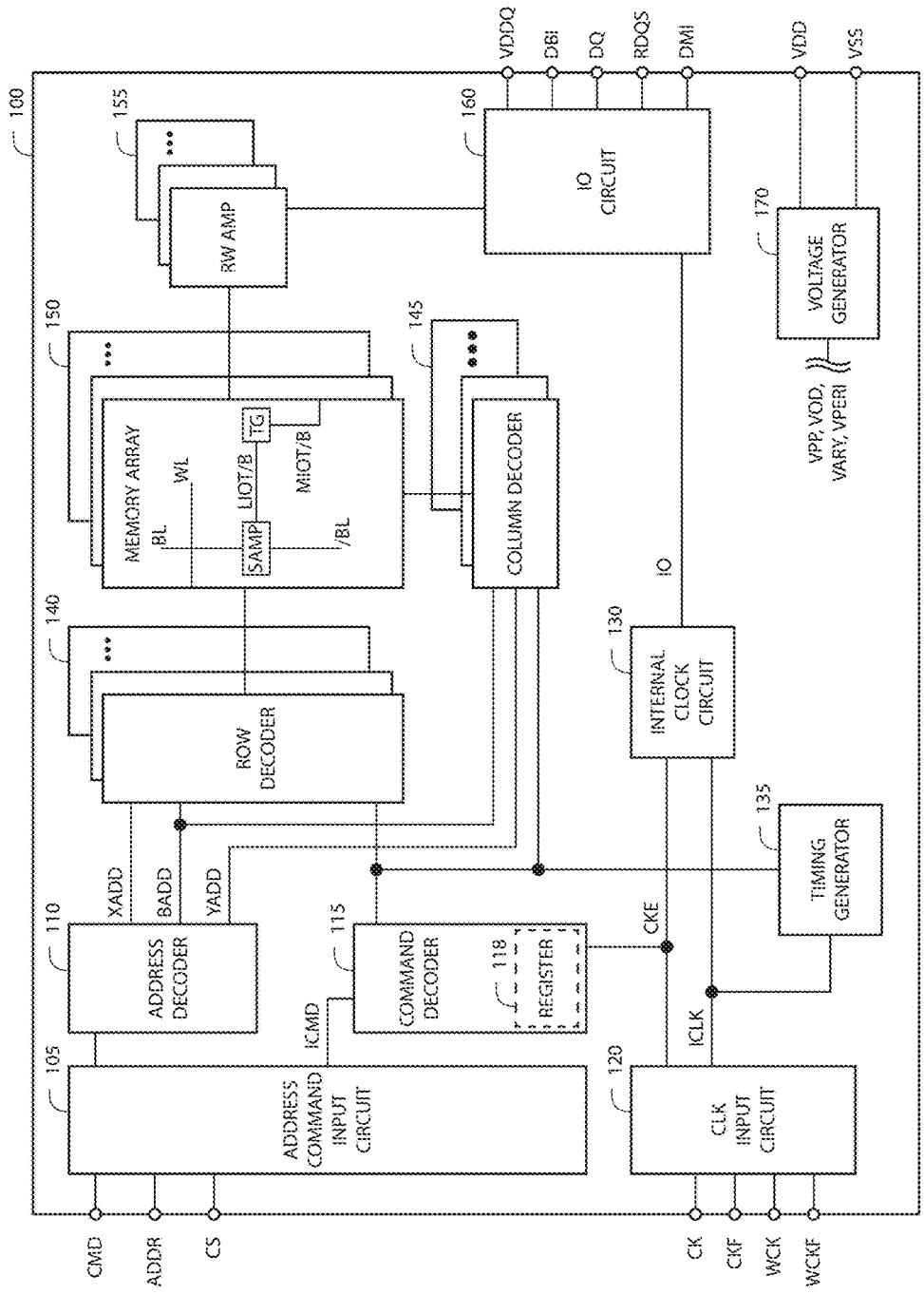
FIG. 1 is a block diagram schematically illustrating a memory device in accordance with an embodiment of the present technology.

The memory cells of a memory device may be periodically refreshed to prevent data loss. For example, volatile memory devices, such as DRAM devices, may periodically refresh memory cells (e.g., by restoring charge levels on the memory cells) to prevent data loss due to charge leakage. Non-volatile memory devices, such as PCM, MRAM, or FeRAM devices, may periodically refresh memory cells and/or may perform other operations to maintain a cell's integrity (e.g., by inverting a data state therein, overvoltaging, etc.). Maintenance operations are intended to prevent data loss due to imprint or drift, in which the material properties (e.g., polarization) of the cells may be negatively impacted by environmental conditions or the persistent storage of a data state therein.

One approach to refreshing or maintaining memory cells involves performing refresh operations on a per-die basis (e.g., refreshing the same row of memory cells in every bank of a die simultaneously). This approach can significantly degrade memory device performance as it can prevent an entire die from serving memory requests while being refreshed. The per-die approach may also result in a large current draw at the memory device, relative to typical operation, and may thus increase power consumption by the memory device beyond tolerable limits for certain applications (e.g., mobile applications).

Another approach to refreshing or maintaining memory cells involves performing operations on a per-bank basis, to permit one memory bank to be accessed while another bank in the same die is being refreshed or maintained. In this per-bank approach, the banks can be refreshed in a predetermined order (e.g., round-robin sequentially) or based upon an availability of the bank to be refreshed (e.g., when the bank is not being accessed). Banks could be maintained in a similar manner. If the banks are refreshed non-sequentially, however, this method may result in some banks going without a refresh or maintenance operation because of the memory device's inability to keep and accurately account for which banks have been refreshed and which have not.

For instance, memory devices commonly employ a single row counter that indicates which row is targeted by a refresh operation, and which is incremented once the number of bank-refresh operations is equal to the number of banks. This single row counter is relatively simple to implement and manage, and therefore provides a low-complexity option for managing refresh operations. But the use of a single row counter may also necessitate that before any bank is refreshed a second time, all of the banks be refreshed once, lest the row counter increment and cause an un-refreshed row of data in one of the banks to lose data integrity.

To overcome this limitation, several embodiments of the present technology are directed to memory devices, systems including memory devices, and methods of operating memory devices in which multiple counters are provided to permit memory refresh commands greater freedom in targeting subsets of the memory device for data refresh operations. In one embodiment, a memory device is provided, comprising a plurality of memory banks, and circuitry configured to (i) store a plurality of values, each of the plurality of values corresponding to one of the plurality of memory banks; (ii) refresh first data stored in a first one of the plurality of memory banks; and (iii) update a first one of the plurality of values corresponding to the first one of the plurality of memory banks based at least in part on refreshing the first data.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The memory array 150 may be refreshed or maintained as described herein. A refresh operation, as described herein, may be initiated by a host device or memory controller, for example, and may include accessing one or more rows (e.g., WL) and discharging cells of the accessed row to a corresponding SAMP. While the row is opened (i.e., while the access WL is energized), the SAMP may compare the voltage resulting from the discharged cell to a reference. The SAMP may then write back a logic value (i.e., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization or the like. Other refresh schemes or methods may also be employed.

The memory array 150 may be refreshed or maintained using a per-bank scheme in which the same bank of memory array 150 may be refreshed several times before another bank of the same rank is refreshed. That is, the memory array 150 may be refreshed or maintained without restrictions on the order or frequency for which refresh or other maintenance operations may be taken on certain banks. Additionally or alternatively, banks of the memory array 150 may be maintained with greater freedom than legacy per-bank refresh restrictions have imposed.

Figure 2:
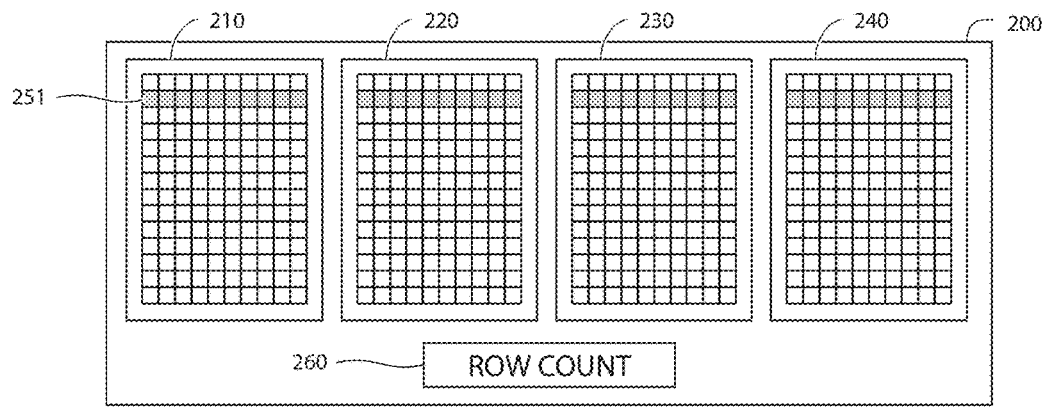
FIG. 2 is a block diagram schematically illustrating a method for memory bank maintenance in accordance with one aspect of the present disclosure.

As set forth above, the memory cells of a memory device may be periodically refreshed to prevent data loss, either due to charge leakage or imprint effects. In one approach, illustrated in accordance with one aspect of the present disclosure in FIG. 2, a memory device 200 with multiple memory banks 210-240 may be configured to refresh the same row 251 of memory cells in every memory bank simultaneously. Memory device 200 may be an example of memory device 100 and memory banks 210-240 may be examples of banks within memory array 150. In this approach, the memory device 200 may be configured to track a single row address (e.g., in a register or counter such as counter 260) corresponding to the most-recently refreshed row (e.g., or the next-to-be-refreshed row) in each memory bank.

Figure 3A:
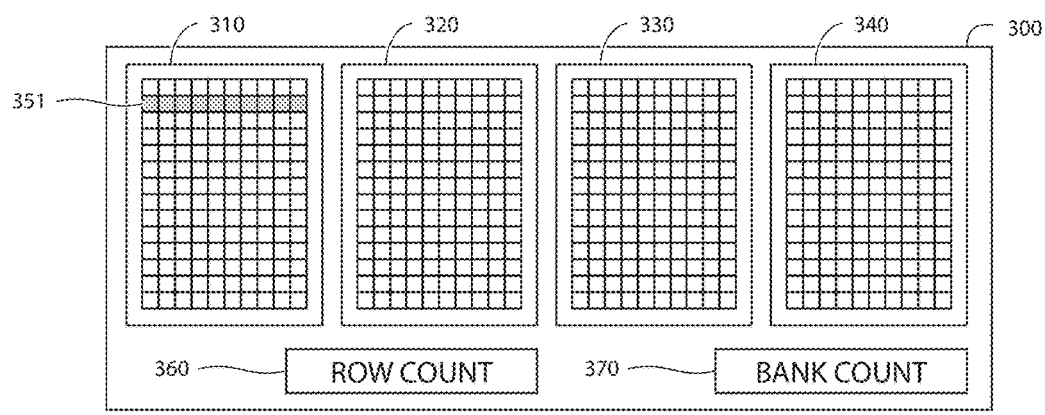
FIGS. 3A-3D are block diagrams schematically illustrating a method for memory bank maintenance in accordance with one aspect of the present disclosure.
Figure 3B:
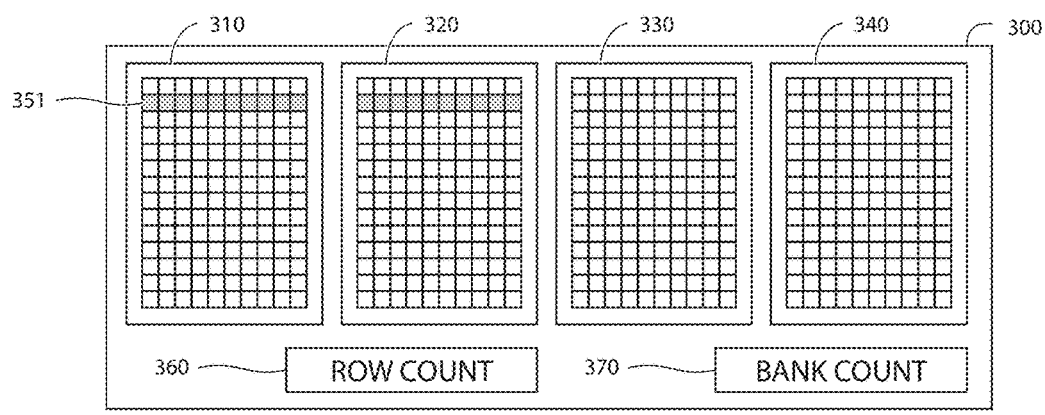
Figure 3C:
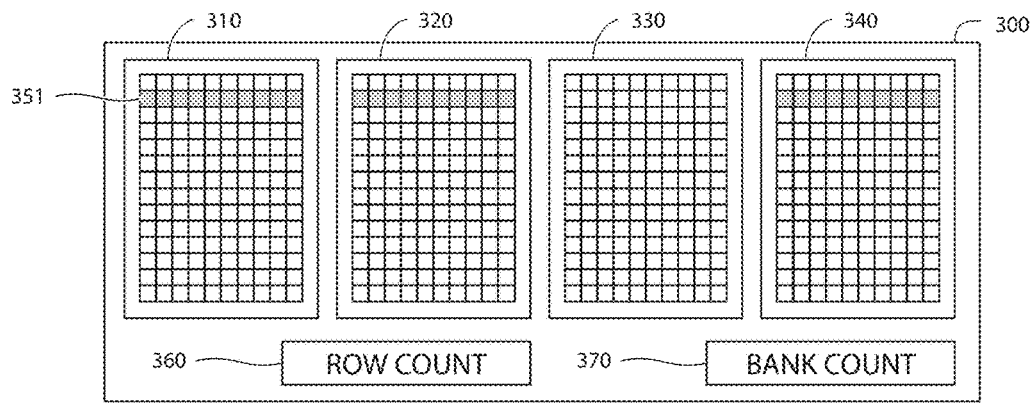
Figure 3D:
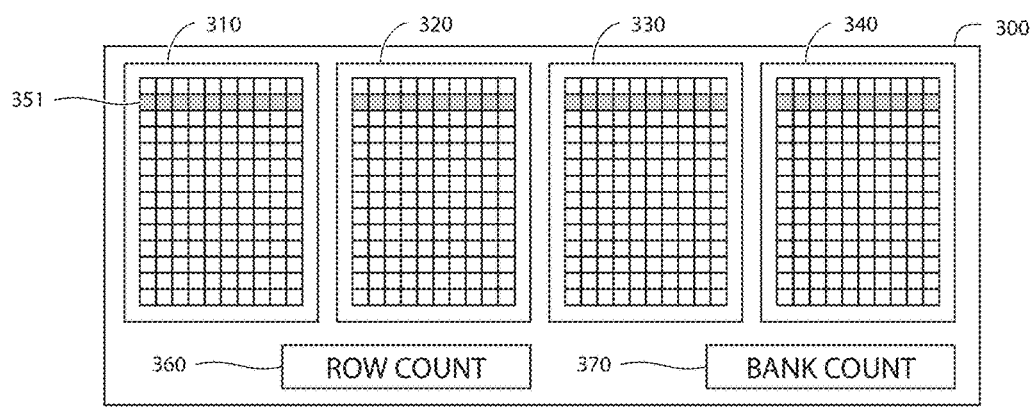

In another approach, in accordance with one aspect of the present disclosure in FIGS. 3A-3D, a memory device 300 with multiple memory banks 310-340 may be configured to refresh the same row 351 of memory cells in every memory bank sequentially. Memory device 300 may be an example of memory device 100 and memory banks 310-340 may be examples of banks within memory array 150. In this regard, FIG. 3A illustrates the memory device 300 after refreshing the row 351 of the first memory bank 310, FIG. 3B illustrates the memory device 300 after subsequently refreshing the row 351 of the second memory bank 320, FIG. 3C illustrates the memory device 300 after refreshing the row 351 of the fourth memory bank 340, and FIG. 3D illustrates the memory device 300 after refreshing the row 351 of the third memory bank 330. In this approach, the memory device 300 may be configured to track a single row address (e.g., in a register or counter such as counter 360) corresponding to the most-recently refreshed row (e.g., or the next-to-be-refreshed row) in each memory bank, as well as a count of how many of the memory banks have been refreshed (e.g., in a register or counter such as counter 370). When the count of memory banks that have been refreshed is increased (e.g., following a refresh operation) to equal the number of memory banks in the memory device 300 (e.g., once all four banks 310-340 have been refreshed), the tracked row address can be updated to another row (e.g., a subsequent row or the like) and the count of the refreshed banks in the counter 370 can be reset to 0.

As previously set forth, a drawback to both of these approaches is the limitation that a single memory bank, after refreshing a first row, cannot refresh a second row therein until the first row in every other memory bank is also refreshed (e.g., due to the reliance upon a single tracked row address shared among all the memory banks). Accordingly, embodiments of the present technology may overcome this limitation by tracking addresses for refresh operations on more granular level than per-bank.

For example, FIGS. 4A-4D are block diagrams schematically illustrating a method for memory bank maintenance in accordance with an embodiment of the present technology. The memory device 400 includes a plurality of memory banks 410-440, each having a plurality of rows of memory cells, such as row 451. Memory device 400 may be an example of memory device 100 and memory banks 410-440 may be examples of banks within memory array 150. The memory device 400 further includes circuitry (e.g., one or more registers, latches, embedded memories, etc.) such as counters 461-464 configured to track row addresses, each corresponding to one of the memory banks 410-440. Counters 461-464 may be examples of memory registers such as memory register 118 of memory device 100. The memory device 400 further includes circuitry (e.g., such as the row decoder 140, the column decoder 145, the command decoder 150, the input/output circuit 160, WLs, SAMPs, and/or the read/write amplifiers 155 of FIG. 1) configured to refresh data stored in the rows of memory cells of each bank 410-440. Because separate row addresses are tracked for each bank 410-440, the memory device is not constrained to refresh the same row in each bank 410-440 before refreshing another row in one of the banks 410.

Figure 4A:
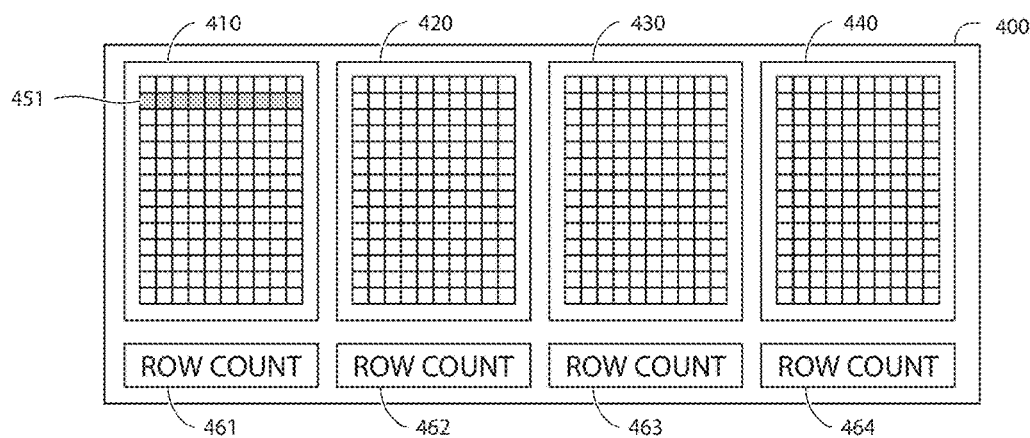
FIGS. 4A-4D are block diagrams schematically illustrating a method for memory bank maintenance in accordance with an embodiment of the present technology.
Figure 4B:
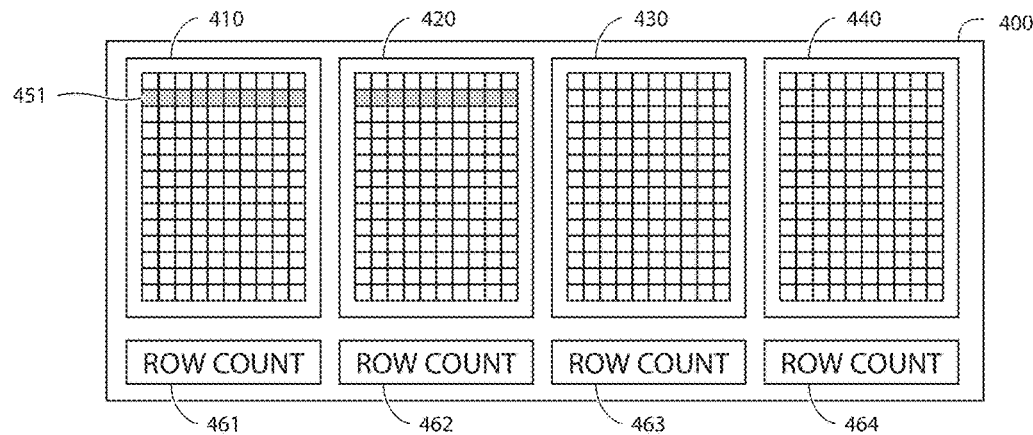

For example, FIG. 4A illustrates the memory device 400 after a first row 451 has been refreshed in the first bank 410. Corresponding to this refresh operation (e.g., simultaneously with, shortly before or shortly after the refresh operation), the value stored in the first row counter 461 is updated (e.g., with the address of the updated row 451, or alternatively with an address of a next-to-be updated row). FIG. 4B illustrates the memory device 400 after the first row 451 has been refreshed in the second bank 420, subsequent to the refresh of the first row 451 in the first bank 410 illustrated in FIG. 4A. Corresponding to this refresh operation, the value stored in the second row counter 462 is updated in a similar fashion.

Figure 4C:
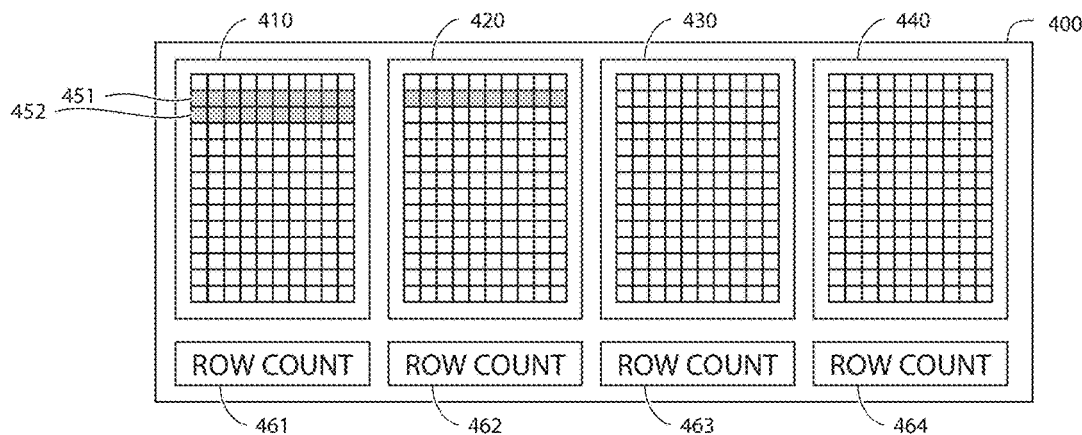
Figure 4D:
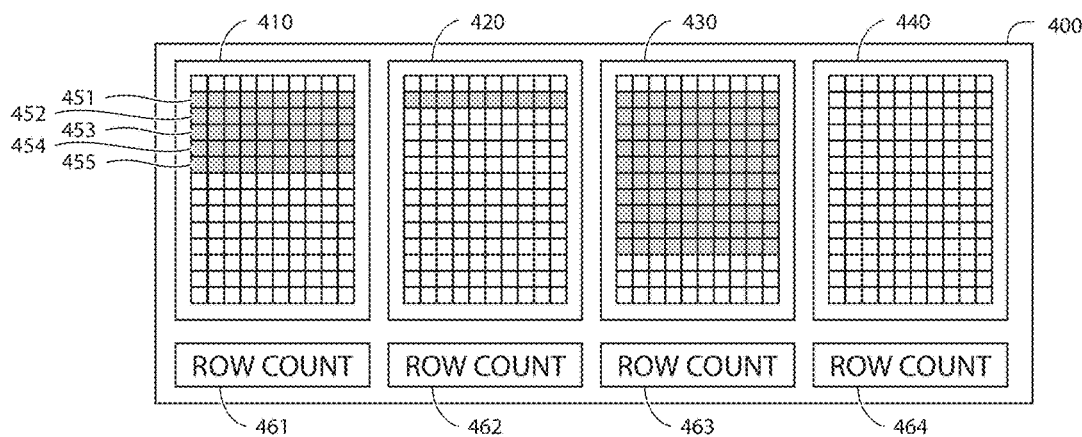

Turning to FIG. 4C, an advantage of the present approach is readily apparent, as the memory device 400 is illustrated after a second row 452 has been refreshed in the first bank 410, before the first row 451 has been refreshed in the remaining banks 430 and 440 of the memory device. Corresponding to this refresh operation, the value stored in the first row counter 461 is again updated (e.g., with the address of the updated row 452, or alternatively with an address of a next-to-be updated row). Because memory device 400 tracks separate row addresses for each of the banks 410-440, the updating of the first row counter 461 poses no threat to the data integrity of the other banks 420-440, unlike the foregoing approaches illustrated in FIGS. 2 and 3A-3D. As a result of this advantage, each bank 410-440 of the memory device 400 can be the target of a refresh operation (e.g., targeted by a host device connected to the memory device 400) independently of the other banks 410-440 and regardless of the status of the data therein (e.g., regardless of whether a refresh operation has recently been performed on the other banks, and regardless of the address of most-recently performed refresh operation thereon). For example, FIG. 4D illustrates the memory device 400 after a number of rows 451-455 have been refreshed in the first bank 410, only the first row has been refreshed in the second bank 420, an even greater number of rows has been refreshed in the third bank 430, and no rows have been refreshed in the fourth bank 440.

This approach to memory refresh operations can provide a number of benefits relating to efficiency in scheduling refresh operations. For example, in a memory device in which one or more banks contain no data, or contain data which is no longer valid, it may provide an increase in performance to forego performing refresh operations on that memory bank. Moreover, for memory banks of memory media with longer retention times (e.g., with less susceptibility to charge leakage from the charge storage locations) or less susceptibility to imprint (e.g., with data storage structures that are more resistant to preferential polarization, domain pinning and/or other undesirable hysteresis shifts while retaining an unchanging data state), it may be advantageous to schedule less frequent refresh operations than for memory banks with shorter retention times or greater susceptibility to imprint.

Although in the foregoing example embodiments, memory devices have been described and illustrated as tracking row addresses on a per-bank basis by including a single row counter corresponding to each bank, those skilled in the art will readily appreciate that the present technology has application to memory devices managing refresh operations with different granularities. For example, memory devices in which the number of row counters is a multiple of the number of banks, or in which the number of banks is a multiple of the number of row counters, can be provided to track refresh operations on a sub-bank basis (e.g., in which groups of rows within a single bank correspond to a row counter), a per-group-of-banks basis, or the like can also benefit from the foregoing approach to independent memory maintenance.

Moreover, although in the foregoing example embodiments, memory devices have been described and illustrated performing refresh operations on a per-row basis, those skilled in the art will readily appreciate that the present technology has application to memory devices performing refresh operations on different arrangements of memory cells. For example, memory devices in which refresh operations are performed on a per-column basis, a per-block basis, a per-page basis, a per-cell basis, or the like can also benefit from the foregoing approach to independent memory maintenance.

Furthermore, although in the foregoing example embodiments, memory devices have been described and illustrated as performing refresh operations (e.g., to restore charge to volatile memory cells or invert data states in non-volatile memory cells), those skilled in the art will readily appreciate that the present technology has application to memory devices utilizing other maintenance operations. In this regard, memory devices which perform maintenance operations such as background wear-leveling (e.g., in which memory cells which are the target of more operations than other memory cells are remapped to more evenly distribute the wearing effects of operations among memory cells in an array), garbage collection (e.g., in which memory cells that no longer contain valid data are subjected to delayed processing, such as an erase operation or the like) and others can also benefit from the foregoing approaches to independent memory maintenance.

In accordance with another aspect of the present technology, the additional freedom of scheduling refresh and other maintenance operations provided by the foregoing approach can be utilized to refresh on an "as-needed" basis. In this regard, a memory device or a host device connected thereto can be configured to track operations (e.g., read operations, write operations, erase operations, activate operations, etc.) or device uptime and to determine based thereon whether a refresh operation for a particular row, bank or other subsection of the memory array is warranted. With the freedom to independently refresh or maintain banks or other sub-divisions of memory provided by the foregoing approach, a memory device can either internally manage its refresh operations (e.g., by determining when a refresh operation is warranted based on tracked activity or uptime and performing the refresh operation when the refresh target is not otherwise scheduled), or it can facilitate host scheduling of refresh operations by providing information (e.g., a communication on the memory bus, a voltage on a device pin, etc.) identifying a needed refresh operation to the host.

Figure 5:
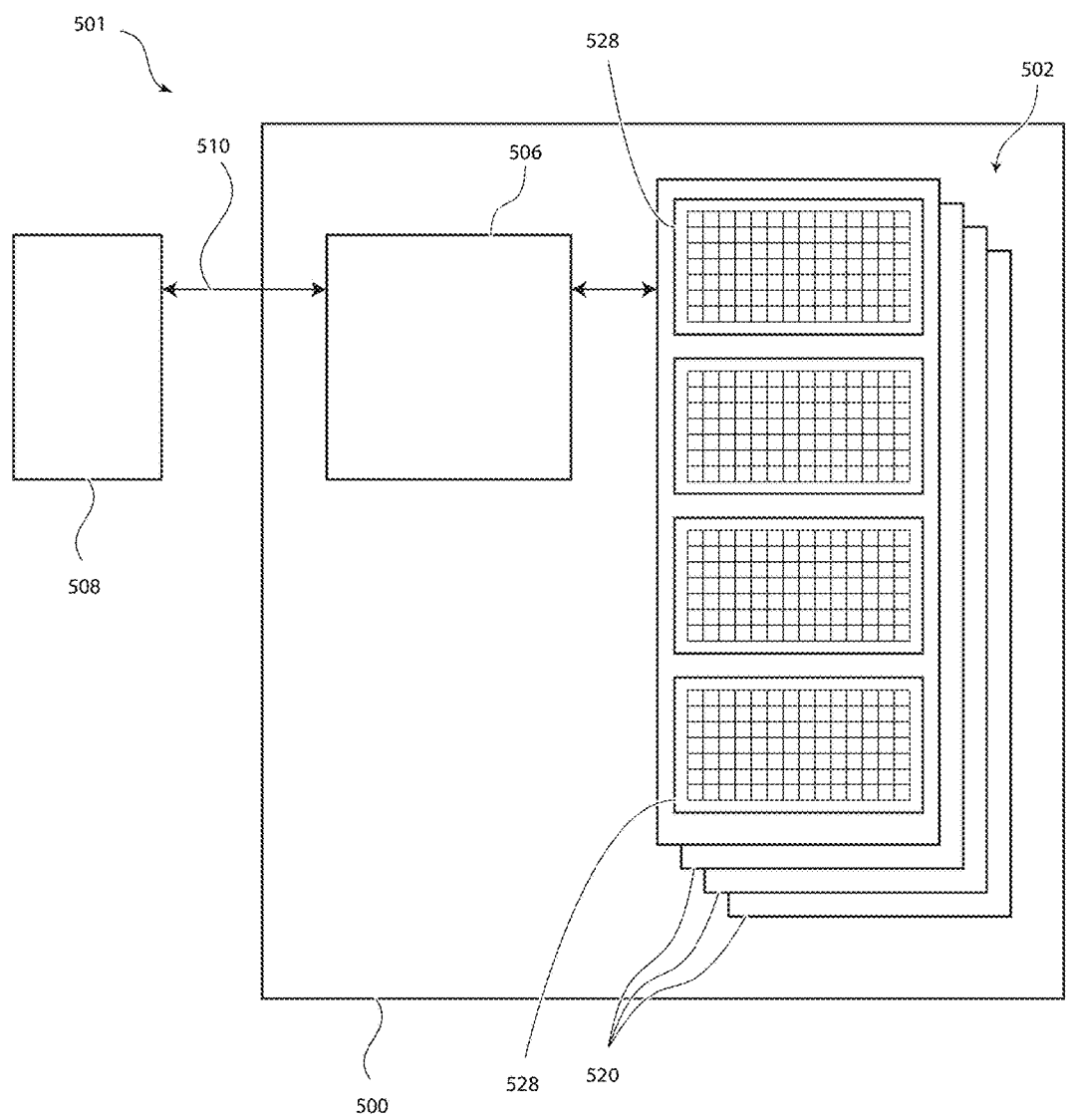
FIG. 5 is a block diagram schematically illustrating a memory system in accordance with an embodiment of the present technology.

In this regard, FIG. 5 is a block diagram of a system 501 having a memory device 500 configured in accordance with an embodiment of the present technology. As shown, the memory device 500 includes a main memory 502 (e.g., DRAM, NAND flash, NOR flash, FeRAM, PCM, etc.) and control circuitry 506 operably coupled to a host device 508 (e.g., an upstream central processor (CPU)). The main memory 502 includes a plurality of memory units 520, which each include a plurality of memory cells. The memory units 520 can be individual memory dies, memory planes in a single memory die, a stack of memory dies vertically connected with through-silicon vias (TSVs), or the like. For example, in one embodiment, each of the memory units 520 can be formed from a semiconductor die and arranged with other memory unit dies in a single device package (not shown). In other embodiments, multiple memory units 520 can be co-located on a single die and/or distributed across multiple device packages. The memory units 520 may, in some embodiments, also be sub-divided into memory regions 528 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 502 and/or the individual memory units 520 can also include other circuit components (not shown), such as multiplexers, decoders, buffers, read/write drivers, address registers, data out/data in registers, etc., for accessing and/or programming (e.g., writing) the memory cells and other functionality, such as for processing information and/or communicating with the control circuitry 506 or the host device 508. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 500 can include only one memory unit 520. Alternatively, the memory device 500 can include two, three, four, eight, ten, or more (e.g., 16, 32, 64, or more) memory units 520. Although the memory units 520 are shown in FIG. 5 as including four memory regions 528 each, in other embodiments, each memory unit 520 can include one, two, three, eight, or more (e.g., 16, 32, 64, 100, 128, 256 or more) memory regions.

In one embodiment, the control circuitry 506 can be provided on the same die as the main memory 502 (e.g., including command/address/clock input circuitry, decoders, voltage and timing generators, input/output circuitry, etc.). In another embodiment, the control circuitry 506 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 506 can include a processor configured to execute instructions stored in memory to perform various processes, logic flows, and routines for controlling operation of the memory device 500, including managing the main memory 502 and handling communications between the memory device 500 and the host device 508. In some embodiments, the control circuitry can include embedded memory with memory registers for storing, e.g., row counters, bank counters, memory pointers, fetched data, etc. In another embodiment of the present technology, a memory device may not include control circuitry, and may instead rely upon external control (e.g., provided by the host device 508, or by a processor or controller separate from the memory device).

The host device 508 can be any one of a number of electronic devices capable of utilizing memory for the temporary or persistent storage of information, or a component thereof. For example, the host device 508 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 508 may be a networking device (e.g., a switch, a router, etc.) or a recorder of digital images, audio and/or video, a vehicle, an appliance, a toy, or any one of a number of other products. In one embodiment, the host device 508 may be connected directly to memory device 500, although in other embodiments, the host device 508 may be indirectly connected to memory device (e.g., over a networked connection or through intermediary devices).

In operation, the control circuitry 506 can directly write or otherwise program (e.g., erase) the various memory regions of the main memory 502. The control circuitry 506 communicates with the host device 508 over a host-device bus or interface 510. In some embodiments, the host device 508 and the control circuitry 506 can communicate over a dedicated memory bus (e.g., a DRAM bus). In other embodiments, the host device 508 and the control circuitry 506 can communicate over a serial interface, such as a serial attached SCSI (SAS), a serial AT attachment (SATA) interface, a peripheral component interconnect express (PCIe), or other suitable interface (e.g., a parallel interface). The host device 508 can send various requests (in the form of, e.g., a packet or stream of packets) to the control circuitry 506. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the control circuitry 506 can be configured to track operations (e.g., read operations, write operations, erase operations, activate operations, etc.) performed in the main memory 502 (e.g., in a register or table in an embedded memory of the control circuitry 506) in multiple memory units 520 to facilitate performing refresh operations on an as-needed basis. In this regard, the control circuitry 506 can be configured to compare the number or rate of operations experienced by different memory units 520 and to perform or schedule refresh operations on the memory units 520 based at least in part on a comparison between the number or rate of operations experienced by the memory units 520. Alternatively, the control circuitry 506 can be configured to perform or schedule refresh operations on the memory units 520 based at least in part on a comparison of each memory unit 520 to one or more predetermined thresholds (e.g., threshold numbers of operations, threshold rates of operations, etc.). Accordingly, a memory unit 520 which is the target of operations that exceed a threshold number or rate can be refreshed more frequently than another unit 520, due to the freedom with which different units 520 can be subjected to out-of-order refresh operations provided by embodiments of the present technology.

Figure 6:
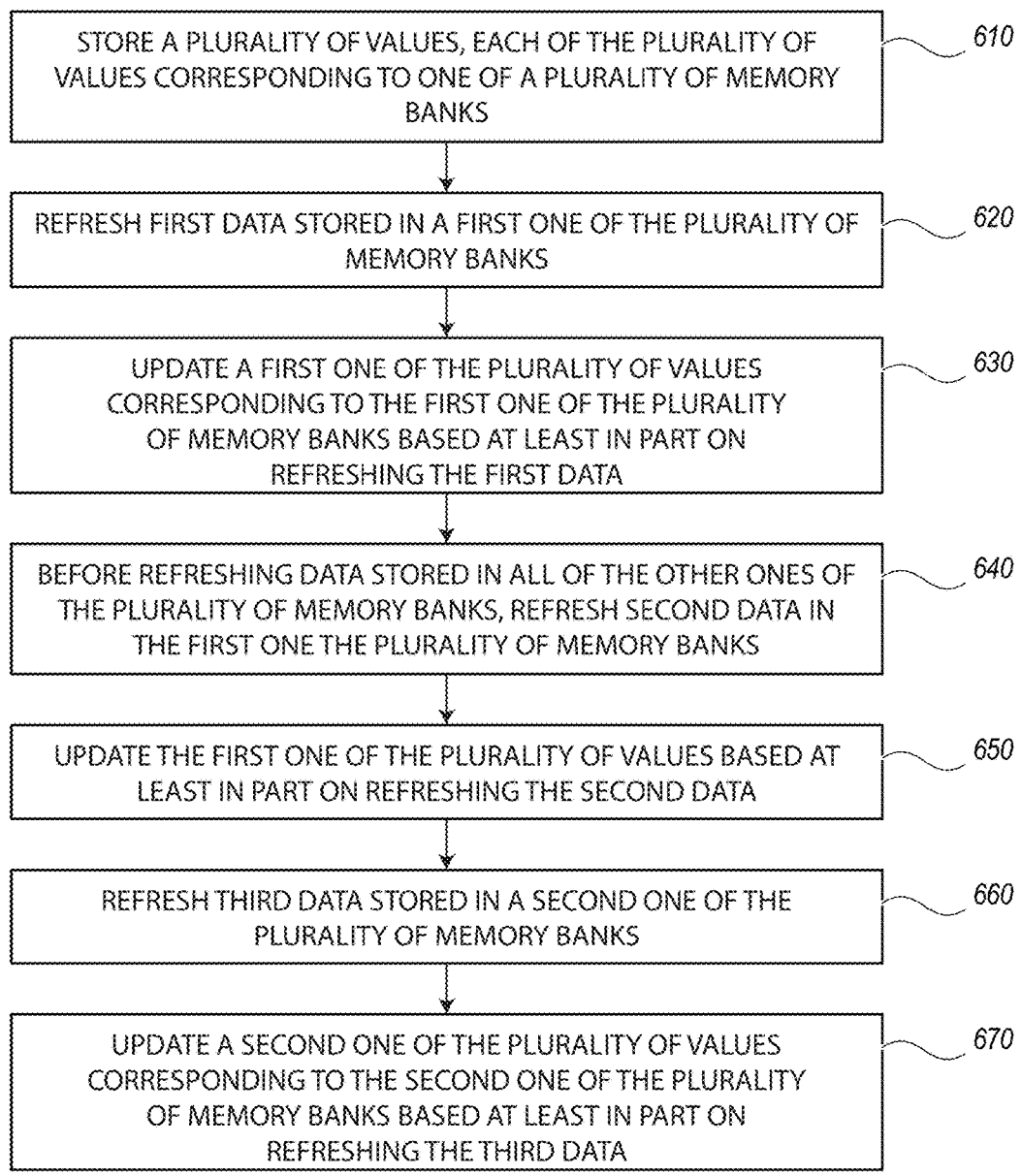
FIG. 6 is a flow chart illustrating a method of operating a memory device in accordance with an embodiment of the present technology.

FIG. 6 is a flow chart illustrating a method of operating a memory device in accordance with an embodiment of the present technology. The method includes storing a plurality of values (box 610), wherein each of the plurality of values corresponds to one of a plurality of memory banks of the memory device. In accordance with one aspect of the present technology, the storing feature of box 610 can be performed by a register (e.g., register 118 of FIG. 1), an embedded memory, or even a memory array (e.g., memory array 150 of FIG. 1). The method further includes refreshing first data stored in a first one of the plurality of memory banks (box 620). In accordance with one aspect of the present technology, the refreshing feature of box 620 can be performed by one or more of the row decoder 140, the column decoder 145, WL, SAMP, the command decoder 150, the input/output circuit 160, the read/write amplifiers 155, and/or the memory array 150 of FIG. 1. The method further includes updating a first one of the plurality of values corresponding to the first one of the plurality of memory banks based at least in part on refreshing the first data. In accordance with one aspect of the present technology, the updating feature of box 630 can be performed by one or more of the command decoder 150 and the register 118 of FIG. 1.

The method can further include refreshing, before refreshing data stored in all of the other ones of the plurality of memory banks, second data in the first one the plurality of memory banks (box 640). In accordance with one aspect of the present technology, the refreshing feature of box 640 can be performed by one or more of the row decoder 140, the column decoder 145, WL, SAMP, the command decoder 150, the input/output circuit 160, the read/write amplifiers 155, and/or the memory array 150 of FIG. 1. The method can further comprise updating the first one of the plurality of values based at least in part on refreshing the second data (box 650). In accordance with one aspect of the present technology, the updating feature of box 650 can be performed by one or more of the command decoder 150 and the register 118 of FIG. 1

The method can further include refreshing third data stored in a second one of the plurality of memory banks (box 660) and updating a second one of the plurality of values corresponding to the second one of the plurality of memory banks based at least in part on refreshing the third data (box 670). In accordance with one aspect of the present technology, the refreshing and updating features of box 660 and 670 can be performed by one or more of the row decoder 140, the column decoder 145, WL, SAMP, the command decoder 150, the register 118 the input/output circuit 160, the read/write amplifiers 155, and/or the memory array 150 of FIG. 1.

Figure 7:
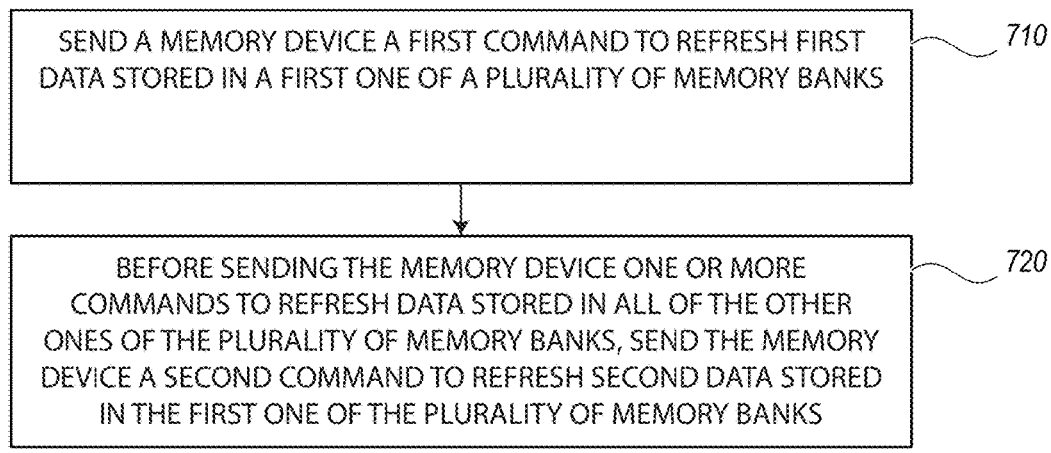
FIG. 7 is a flow chart illustrating a method of operating a memory system in accordance with an embodiment of the present technology.

FIG. 7 is a flow chart illustrating a method of operating a memory device in accordance with an embodiment of the present technology. The method includes sending a memory device a first command to refresh first data stored in a first one of a plurality of memory banks of the memory device (box 710). The method further includes sending the memory device, before sending the memory device one or more commands to refresh data stored in all of the other ones of the plurality of memory banks, a second command to refresh second data stored in the first one of the plurality of memory banks (box 720). In accordance with one aspect of the present technology, the sending features of box 710 and 720 can be performed by a host device connected to a memory device such as the memory device 100 of FIG. 1.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:
    storing a plurality of values, each value of the plurality of values corresponding to one memory bank of a plurality of memory banks of a memory device;
    refreshing first data stored in a first memory bank of the plurality of memory banks; and
    updating a first value of the plurality of values corresponding to the first memory bank of the plurality of memory banks based at least in part on refreshing the first data.

2. The method of claim 1, further comprising:
    subsequent to refreshing the first data, and before refreshing data stored in all of the other memory banks of the plurality of memory banks, refreshing second data in the first memory bank the plurality of memory banks; and
    updating the first value of the plurality of values based at least in part on refreshing the second data.

3. The method of claim 1, wherein the first data corresponds to a first row of the first memory bank of the plurality of memory banks.

4. The method of claim 1, wherein each of the plurality of values corresponds to a row address in a corresponding memory bank of the plurality of memory banks.

5. The method of claim 4, wherein updating the first value of the plurality of values comprises replacing the row address of the refreshed first data with another row address of the corresponding memory bank of the plurality of memory bank.

6. The method of claim 1, further comprising:
    refreshing second data stored in a second memory bank of the plurality of memory banks; and
    updating a second value of the plurality of values corresponding to the second memory bank of the plurality of memory banks based at least in part on refreshing the second data.

7. A method comprising:
    sending a first command to refresh first data stored in a first memory bank of a plurality of memory banks of a memory device; and
    subsequent to sending the first command, and before sending one or more commands to refresh data stored in all of the other ones of the plurality of memory banks, sending a second command to refresh second data stored in the first memory bank of the plurality of memory banks.

8. The method of claim 7, wherein the first command is configured to instruct the memory device to perform a refresh operation on less than all of the plurality of memory banks.

9. The method of claim 7, wherein the first command is configured to instruct the memory device to perform a refresh operation on only the first one of the plurality of memory banks.

10. The method of claim 7, wherein the first command is sent to the memory device by a host device operably connected thereto.

11. The method of claim 7, wherein the memory device comprises a controller, and wherein the first command is sent by the controller.

12. The method of claim 11, wherein the controller sends the second command based at least in part on a determination performed by the controller to refresh the second data before refreshing data stored in all of the other ones of the plurality of memory banks.

13. The method of claim 12, wherein the controller tracks a number of operations performed on the first memory bank, and wherein the determination is based at least in part on the tracked number of operations.

14. The method of claim 12, wherein the controller tracks a rate at which operations are performed on the first memory bank, and wherein the determination is based at least in part on the tracked rate.

15. The method of claim 11, wherein the controller sends the first command without communicating the first command with a host device operably connected to the memory device.

16. A method comprising:
    sending a first command configured to instruct a memory device to perform a first refresh operation on a subset of a plurality of memory banks of the memory device; and
    subsequent to sending the first command, and before sending one or more commands configured to instruct the memory device to perform refresh operations in any of the plurality of memory banks other than the subset, sending a second command configured to instruct the memory device to perform a second refresh operation on at least one memory bank of the subset of the plurality of memory banks.

17. The method of claim 16, wherein the subset comprises a single memory bank of the plurality of memory banks.

18. The method of claim 16, wherein the second command is sent based at least in part on a determination to perform the second refresh operation before performing refresh operations in any of the plurality of the memory banks other than the subset.

19. The method of claim 18, further comprising tracking a number of memory operations performed on the subset, and wherein the determination is based at least in part on the tracked number of operations.

20. The method of claim 18, further comprising tracking a rate at which memory operations are performed on the subset, and wherein the determination is based at least in part on the tracked rate.

* * * * *